(12) United States Patent
Chang

(10) Patent No.: US 7,435,363 B2
(45) Date of Patent: *Oct. 14, 2008

(54) METHOD FOR MANUFACTURING DIAMOND FILM

(75) Inventor: Hsiao-Kuo Chang, Taipei (TW)

(73) Assignee: Kinik Company, Taipei (TW)

( * ) Notice: Subject to any disclaimer, the term of this patent is extended or adjusted under 35 U.S.C. 154(b) by 190 days.

This patent is subject to a terminal disclaimer.

(21) Appl. No.: 11/427,215

(22) Filed: Jun. 28, 2006

(65) Prior Publication Data

US 2007/0004325 A1 Jan. 4, 2007

(30) Foreign Application Priority Data

Jul. 1, 2005 (TW) .............................. 94122459 A

(51) Int. Cl.
*C23C 16/01* (2006.01)

(52) U.S. Cl. .................. 264/29.1; 264/81; 427/249.1; 427/249.7; 427/249.8; 427/249.17; 427/249.19; 427/250

(58) Field of Classification Search .............. 427/249.1, 427/249.7, 249.8, 249.17, 249.19, 250; 264/81, 264/29.1, 219; 216/100, 60

See application file for complete search history.

(56) References Cited

U.S. PATENT DOCUMENTS

| | | | | |
|---|---|---|---|---|
| 5,023,068 A | * | 6/1991 | Jones | 423/446 |
| 5,114,745 A | * | 5/1992 | Jones | 427/113 |
| 5,221,501 A | * | 6/1993 | Feldman et al. | 264/1.21 |
| 5,314,652 A | * | 5/1994 | Simpson et al. | 264/81 |
| 5,587,013 A | * | 12/1996 | Ikegaya et al. | 117/89 |
| 5,605,759 A | * | 2/1997 | Prince et al. | 428/408 |
| 5,869,133 A | * | 2/1999 | Anthony et al. | 427/249.8 |

* cited by examiner

*Primary Examiner*—Bret Chen
(74) *Attorney, Agent, or Firm*—Workman Nydegger

(57) ABSTRACT

A method for manufacturing a diamond film is provided. The material with a low thermal decomposition point is used as a substrate. A buffer layer is formed on the substrate by coating or deposition, and then a diamond film is coated thereon, fitting the shape of the required diamond film. With the buffer layer, the coating or deposition uniformity of the diamond film is improved, and the problems such as thermal stress cracking and assembly damage are solved as well. During a subsequent process of forming the diamond film, the substrate is thermally decomposed due to a high temperature, such that the problems such as stripping and die loss are overcome.

14 Claims, 4 Drawing Sheets

METHOD FOR MANUFACTURING DIAMOND FILM

CROSS-REFERENCE TO RELATED APPLICATIONS

This non-provisional application claims priority under 35 U.S.C. § 119(a) on Patent Application No(s). 94122459 filed in Taiwan, R.O.C. on Jul. 1, 2005 the entire contents of which are hereby incorporated by reference.

BACKGROUND OF THE INVENTION

1. Field of Invention

The present invention relates to a method for manufacturing a diamond film applied to applications of diamond film such as acoustic diaphragm, dresser, and more particularly to a method for manufacturing a diamond film using a substrate can be thermally decomposed at a high temperature.

2. Related Art

Diamond material has excellent mechanical characteristics and strength, thus is suitable for manufacturing the acoustic diaphragm which is light weighted and highly rigid, and may be applied in intermediate-frequency, high-frequency loudspeakers. The sound to be sent is produced by the vibration of such an acoustic diaphragm. The higher the acoustic diaphragm vibration frequency is, the stricter the requirement for mechanical strength and quality of the diaphragm is, and the object can be achieved by using the diamond film to manufacture the diaphragm.

A diamond acoustic diaphragm generally adopts a metallic or non-metallic substrate with a preformed shape (which may be a powder, a block, or a film, etc.), which is provided for the diamond film to be grown on. For a metallic substrate, the diamond film attached thereon tends to crack during the process or in an atmospheric temperature due to a large thermal expansion coefficient of the metal. The non-metallic substrate can effectively solve the above problem since it has a thermal expansion coefficient smaller than that of the metallic substrate. However, the non-metallic material suitable for depositing the diamond film by using chemical vapor deposition tends to bond with the carbon atoms, such that it is difficult to split the diamond film off the non-metallic substrate and thereby to become a free body, therefore, not only the substrate tends to be worn out during the splitting off process, but also a defect exists early in the diamond film. From the other aspect, the thermal residual stress between the substrate and diamond film, and the mismatch of the atom crystal lattice still makes the diamond film in danger of cracking diamond film.

SUMMARY OF THE INVENTION

According to one aspect of the invention, a method for manufacturing a diamondfilm is provided for effectively solving the problem of residual stress between the substrate and the diamond film. The substrate can be directly removed during the process to form only a non-substrate diamond film excluding the substrate, saving the cost spent in removing the substrate.

In a method for manufacturing a diamond film according to the present invention, the material with a heat resisting temperature of about 200° to 400° (such as a polymer) is used as the substrate, wherein a buffer layer is first formed on the substrate by coating or deposition, a required diamond film is then formed on the buffer layer by coating or deposition, and the diamond film is continuously heated to be plated on the buffer layer. Also, the high temperature makes the substrate to be removed through a thermal decomposition, thereby obtaining a diamond film excluding the substrate. Therefore, with the design of the buffer layer, the coating or deposition uniformity of the diamond film is improved, and the cracking problem of thermal stress between the diamond film and the substrate is reduced, thus further enhancing the mechanical strength of the diamond film, and reducing the problem of the cracking diamond film.

Furthermore, the manufacturing method of the present invention may be used for making an acoustic diaphragm, a dresser, an instrument for carrying chemical medicine, an electrode for electrochemical analysis (a conductive diamond doped with Boron), a draw die with metal wires, a nozzle of a high-pressure waterjet, a diamond wafer, and a heat sink substrate of an LED or a laser diode.

In order to obtain further understandings of objects, structural characteristics, and functions of the present invention, the invention is illustrated in detail accompanied by drawings below.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

The method for manufacturing a diamond film according to the present invention may be applied to manufacture various kinds of diamond films, without any specifically limited fields, and referring to FIGS. 1A to 1D, the acoustic diaphragm is illustrated in detail as an embodiment.

Figure 1A:
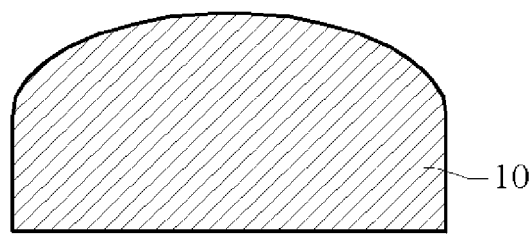
FIG. 1A to 1D are schematic views of a manufacturing flow of the present invention when applied to a diaphragm.
Figure 2:
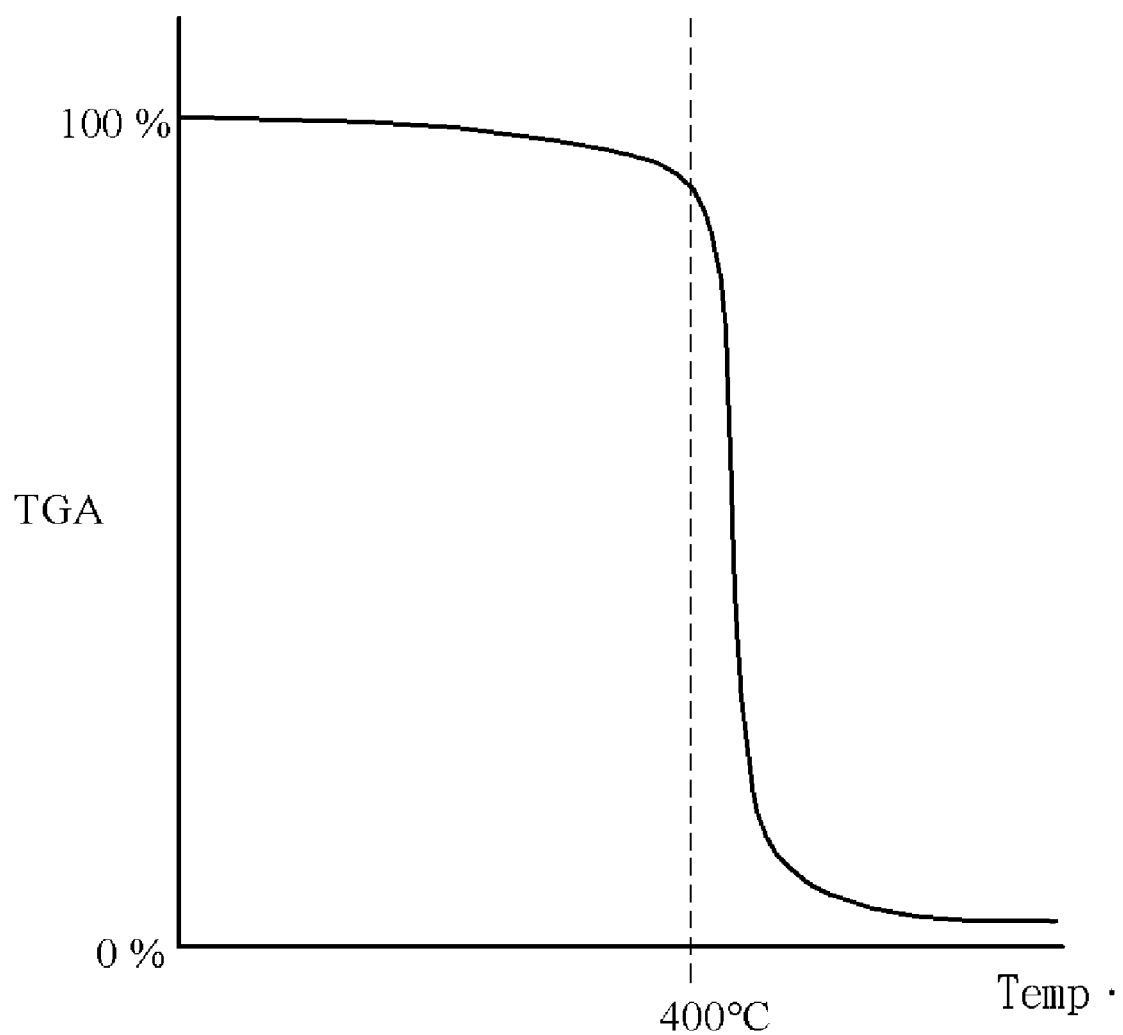
FIG. 2 is a thermogravimetric analysis diagram of a substrate of the present invention.

As shown in FIG. 1A, a substrate 10 is provided, which is a material able to be thermally decomposed with a heat resisting temperature in the range of about 200° to 400°, such as polymer. The shape of the substrate 10 is designed to fit the diaphragm required to be made, and the thickness thereof is in the range of 0.1 mm to 30 mm. FIG. 2 is a thermogravimetric analysis (TGA) diagram of the substrate. As shown in FIG. 2, once the thermal decomposition temperature is exceeded, the thermogravimetric value instantly decreases significantly by about 400 degrees, as shown in the figure.

Figure 1B:
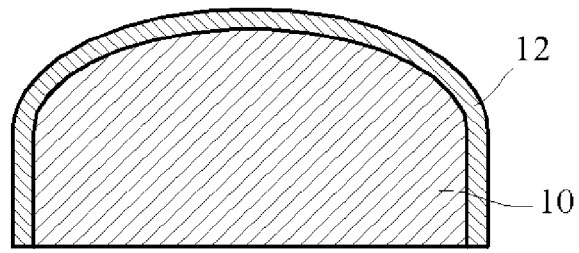
Figure 1C:
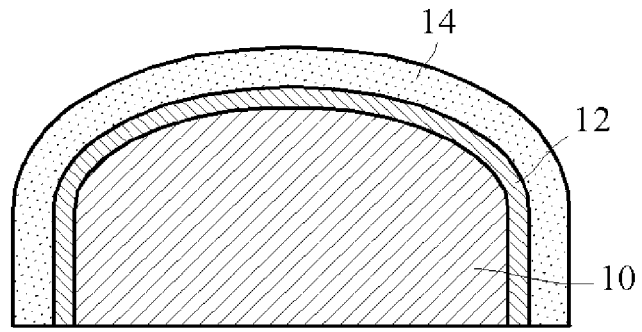

As shown in FIG. 1B, a buffer layer 12 is formed on the substrate 10 by coating or deposition, the usage of which is as described in detail below. Referring to FIG. 1C, a layer of diamond film 14 is formed on the buffer layer 12 by coating or deposition. With the buffer layer 12, the coating or deposition uniformity of the diamond film 14 is improved, and at the same time the thermal stability and thermal diffusion of the substrate 10 in subsequent vacuum coating or deposition circumstance are improved, thereby reducing the cracking problem of thermal stress between the diamond film 14 and the substrate 10. Accordingly, the buffer layer 12 may be a carbon film formed of diamond-like carbon (DLC), amorphous carbon or nano-crystal diamond (NCD), or a metal film made of molybdenum, titanium, tungsten, chromium or copper, or a ceramic film formed of SiC, TiC, CrC, WC, BN, $B_4C$, $Si_3N_4$, TiN, CrN, SiCN, or BCN. The thickness of the buffer layer 12 is in the range of about 0.1 μm to 100 μm, while the thickness of the diamond film 14 is in the range of 3 μm to 150 μm.

Figure 1D:
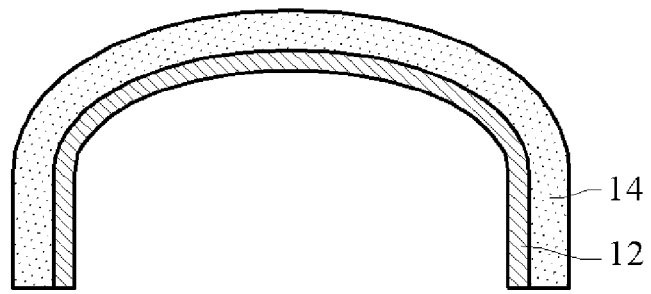

As shown in FIG. 1D, the diamond film 14 is plated on the buffer layer 12 at a high temperature, for example by way of chemical vapor deposition. The substrate 10 is removed due to the thermal decomposition produced by this high temperature (generally above about 800 degrees), thereby forming the diamond film 14 without the substrate 10. Meanwhile, since the diamond film 14 is still attached on the buffer layer 12, the mechanical toughness thereof is enhanced, thereby reducing the problem of subsequent assembly damage. If the substrate 10 is not fully removed after a high temperature, it may be removed once more by additionally applying methods such as mechanical polishing, solvent corrosion, and photochemical dissociation.

Figure 3A:
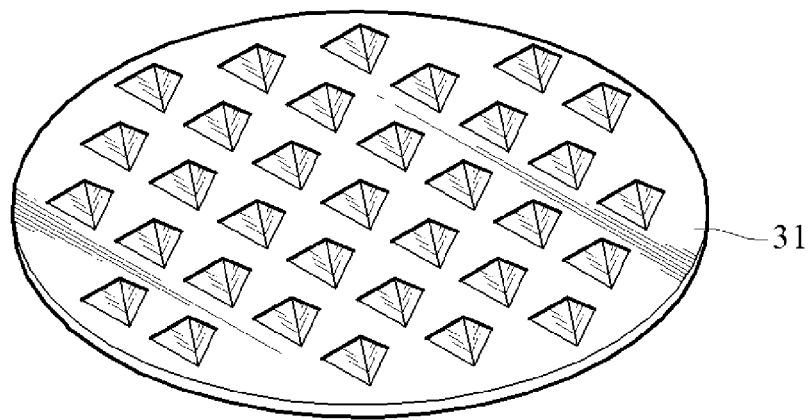
FIGS. 3A to 3C are implementation aspects of the present invention when applied to a dresser.
Figure 3B:
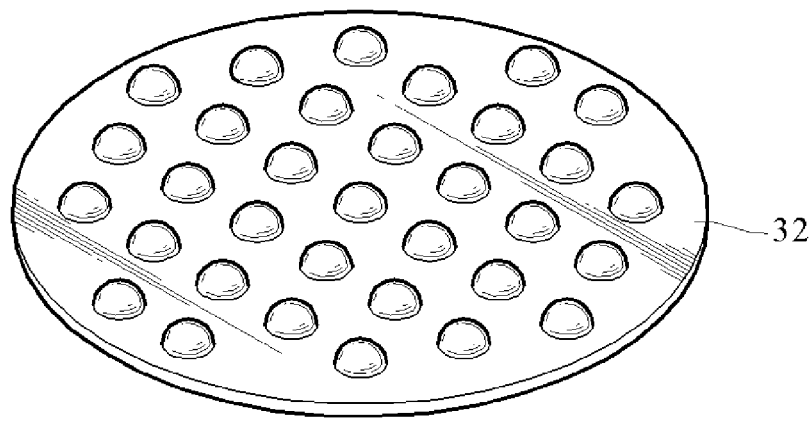
Figure 3C:
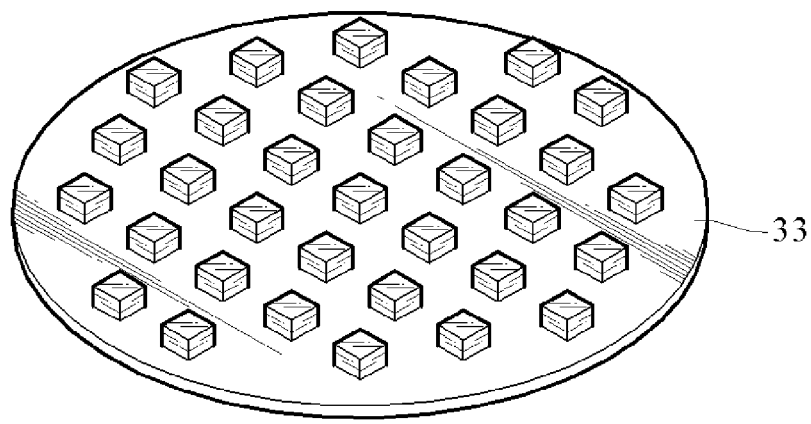
Figure 4A:
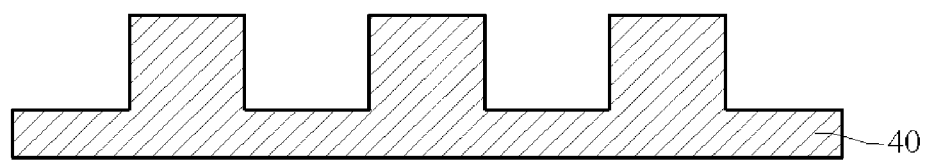
FIGS. 4A to 4E are schematic views of a manufacturing flow of the present invention when applied to a dresser.
Figure 4B:
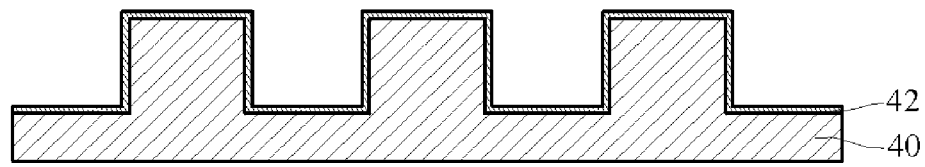
Figure 4C:
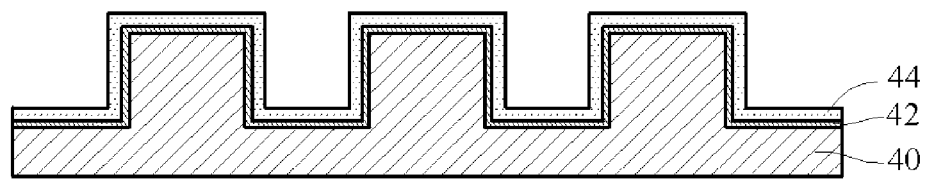
Figure 4D:
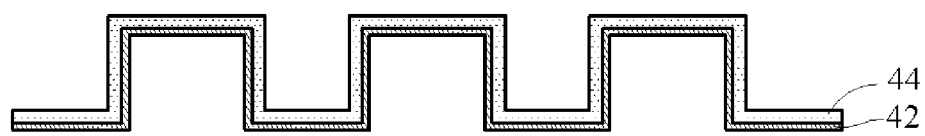
Figure 4E:
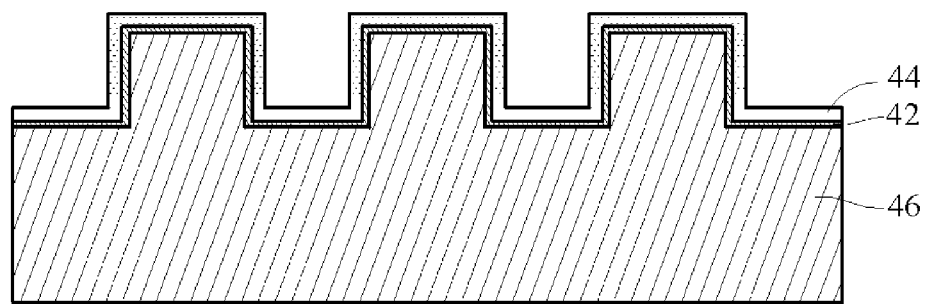

Furthermore, this process may also be applied to various kinds of dressers, instruments for carrying chemical medicine, electrodes for electrochemical analysis (conductive diamonds doped with Boron), draw dies with metal wires, nozzles of high-pressure waterjet, diamond wafers, and heat sink substrates of LEDs or laser diodes. Referring to FIGS. 3A to 3C, only the dresser is illustrated below as an example, and the process may be applied to a dresser 31 with a conical protrusion (see FIG. 3A), or a dresser 32 with a cylindrical protrusion (see FIG. 3B), or a dresser 33 with a square column shaped protrusion (see FIG. 3C).

Continuously referring to FIGS. 4A to 4E, the manufacturing flow of the dresser is described in detail, wherein a substrate 40 is first provided (see FIG. 4A), on which a buffer layer 42 (see FIG. 4B) and a diamond film 44 (see FIG. 4C) are formed by coating or deposition, and then owing to high temperature the diamond film 44 is formed by coating or deposition on the buffer film 42 and the substrate 40 is thermally decomposed (see FIG. 4D) at a high temperature. The condition of the process and various materials are the same as those in the above embodiment, and thus will not be described here, while the thickness and shape are designed according to the product to which the dresser is applied. At last a substrate 46 is formed on the lower surface of the formed diamond film 44 (see FIG. 4E) for a machinery of the dresser to use.

Therefore, with the above two embodiments, the present invention can surely be performed and solve the problem of residual stress between the substrate and the diamond film, and the substrate may be removed directly during the process to form the diamond film body without the substrate, thereby relieving the bother of stripping. Meanwhile the present invention is not limited only to be applied in the diaphragm and the dresser.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a diamond film, comprising the steps of:
providing a polymer substrate, having a heat resisting temperature in the range of 200° C. to 400° C.;
forming a buffer layer on the substrate;
forming a diamond film on the buffer layer at a temperature that is higher than the heat resisting temperature of the polymer substrate, wherein the coating uniformity of the diamond film is improved by the buffer layer; and
removing the polymer substrate by thermally decomposing the polymer substrate while forming the diamond film on the buffer layer.

2. The method for manufacturing a diamond film as claimed in claim 1, wherein the thickness of the substrate is in the range of 0.1 mm to 30 mm.

3. The method for manufacturing a diamond film as claimed in claim 1, wherein the thickness of the buffer layer is in the range of 0.1 μm to 100 μm.

4. The method for manufacturing a diamond film as claimed in claim 1, wherein the buffer layer is a carbon film.

5. The method for manufacturing a diamond film as claimed in claim 4, wherein the material of the carbon film is selected from the group consisting of diamond-like carbon (DLC), amorphous carbon, and nano-crystal diamond (NCD).

6. The method for manufacturing a diamond film as claimed in claim 1, wherein the buffer layer is a metal film.

7. The method for manufacturing a diamond film as claimed in claim 6, wherein the material of the metal film is selected from the group consisting of molybdenum, titanium, tungsten, chromium, and copper.

8. The method for manufacturing a diamond film as claimed in claim 1, wherein the buffer layer is a ceramic film.

9. The method for manufacturing a diamond film as claimed in claim 8, wherein the material of the ceramic film is selected from the group consisting of SiC, TiC, CrC, WC, BN, $B_4C$, $Si_3N_4$, TiN, CrN, SiCN, and BCN.

10. The method for manufacturing a diamond film as claimed in claim 1, wherein the thickness of the diamond film is in the range of 3 μm to 150 μm.

11. The method for manufacturing a diamond film as claimed in claim 1, wherein in the step of heating the diamond film for plating the diamond film on the buffer layer and decomposing the substrate thermally, the diamond film is heated to above 600°.

12. The method for manufacturing a diamond film as claimed in claim 1 further comprising removing the polymer substrate by using a mechanical polishing process, removing the polymer substrate by thermally decomposing the polymer substrate.

13. The method for manufacturing a diamond film as claimed in claim 1, further comprising removing the polymer substrate by using a solvent corrosion process, removing the polymer substrate by thermally decomposing the polymer substrate.

14. The method for manufacturing a diamond film as claimed in claim 1, further comprising removing the polymer substrate by using a photochemical dissocation process, removing the polymer substrate by thermally decomposing the polymer substrate.

* * * * *